United States Patent [19]

Yarman

[11] Patent Number: 4,614,921
[45] Date of Patent: Sep. 30, 1986

[54] LOW PASS π SECTION DIGITAL PHASE SHIFTER APPARATUS

[75] Inventor: Binboga S. Yarman, Çengelköy/İstanbul, Turkey

[73] Assignee: The United States of America as represented by the Secretary of the Air Force, Washington, D.C.

[21] Appl. No.: 767,446

[22] Filed: Aug. 20, 1985

[51] Int. Cl.[4] .................. H03H 7/20; H01P 1/185
[52] U.S. Cl. .................... 333/139; 333/23; 333/161; 333/164; 307/320
[58] Field of Search ............ 333/17 R, 23, 28 R, 333/138–140, 156–164, 174–175, 246; 307/320; 332/30 R, 30 V

[56] References Cited

U.S. PATENT DOCUMENTS

| | | | |
|---|---|---|---|
| 3,278,866 | 10/1966 | Bose | 333/17 R |
| 3,287,626 | 11/1966 | Sprague | 333/138 X |
| 3,718,873 | 2/1973 | Garver | 333/164 |
| 3,745,487 | 7/1973 | Milard et al. | 333/164 |
| 3,849,676 | 11/1974 | Bareyt | 333/138 X |
| 3,882,431 | 5/1975 | Hopwood et al. | 333/139 |
| 4,255,724 | 3/1981 | Bergero | 333/17 L |

OTHER PUBLICATIONS

"Broad-Band Diode Phase Shifters", by R. V. Garver, in IEEE Transactions On Microwave Theory and Techniques, vol. MTT-20, No. 5, May 1972, pp. 314–323.
"Simplified Switched Line Phase Shifter", by A. Schwarzmann, in DEP Symposium on MIC's, May 1971.

Primary Examiner—Marvin L. Nussbaum
Attorney, Agent, or Firm—Donald J. Singer; William Stepanishen

[57] ABSTRACT

A low pass π section digital phase shifter apparatus having an inductor and a diode connected in series between two identical parallel circuits. The parallel circuits connect to the series inductor/diode circuit at both the input and output and each circuit has inductor connected in parallel with a capacitor and a diode to provide balanced insertion loss at each diode switching state. When the diodes of the circuit are in the forward biased state they act as closed short circuit switches. When the diodes are reversed biased, the inductance in the series circuit resonates with the diode capacitance to provide a short circuit path to the RF signal to pass the center frequency of the RF signal at the desired phase.

8 Claims, 4 Drawing Figures

LOW PASS π SECTION DIGITAL PHASE SHIFTER APPARATUS

STATEMENT OF GOVERNMENT INTEREST

The invention described herein may be manufactured and used by or for the Government for governmental purposes without the payment of any royalty thereon.

BACKGROUND OF THE INVENTON

The present invention relates broadly to a digital phase shifter apparatus, and in particular to a low pass π section digital phase shifter apparatus which is suitable for monolithic implementation.

In the prior art many electronic devices such as, for example, phased array systems utilize fundamental phase shifting circuits to achieve important functions. According to well-known prior art designs, phase shifters devices have generally required the use of circuits which employed a number of inductive elements. These prior art discrete element circuits are expensive since they must be built up element by element and to this date, it was not possible to implement an inductor into a monolithic or similar type circuit. In addition, the inductors which are rather expensive, add to the overall circuit cost.

Other prior art phase shifters have been developed to utilize digital techniques in obtaining the phase shift. However, the digital phase shifters in general are even more expensive than the discrete element inductive phase circuits, but they do have the distinct advantage of being mathematically predictable and are susceptible to monolithic implementation as well as batch processing.

At present, it is clear that none of the prior art phase shifters are able to satisfy the dual requirements of economy and small size. Therefore, it would be particularly desirable if such a circuit could be developed, particularly if such a circuit would be susceptible to a monolithic implementation capable such that it would be capable of being produced at low cost in large quantities.

Monolithic low-loss phase shifters at extra high frequencies (EHF) are highly demanded in the military market. In the previous works, two high pass T and π sections and a low pass based T section digital phase shifters which are suitable for monolithic implementation were suggested. The operation of the new circuit is based upon the phase shifting characteristic of a low pass L-C, π network. In the present invention, the complementary version of the low pass based T section is arranged in the form of a π section digtal phase shifter to provide better insertion loss characterstlcs with improved phase tracking capability over the normal conventional approaches.

SUMMARY OF THE INVENTION

The present invention utilizes a pair of parallel resonant circuits which comprise an inductor in parallel with a capacitor that is in series with a diode. The resonant parallel circuit is arranged in a π configuration at the input and output to a series circuit which comprises an inductor in series with a diode. The π section digital phase shifter apparatus exhibits easy practical implementation with balanced insertion loss at each diode switching state. Therefore, it will find wide application in the military communication, system design.

It is one object of the present invention, therefore, to provide an improved low pass π section digital phase shifter apparatus.

It is another object of the invention to provide an improved low pass π section digital phase shifter apparatus wherein the resonant circuit comprises an inductor in parallel with a capacitor which is in series with a diode.

It is yet another object of the invention to provide an improved low pass π section digital phase shifter apparatus wherein the series combination of an inductor and a diode include the parallel combination of an inductor and a capacitor in series with a diode at the input and output to the series inductor/diode combination.

It is still another object of the invention to provide an improved low pass π section digital phase shifter apparatus wherein the insertion loss of the phase shift circuit is balance for each diode conducting state.

These and other advantages, objects and features of the invention will become more apparent after considering the following description taken in conjunction with the illustrative embodiment in the accompanying drawings

DESCRIPTION OF THE PREFERRED EMBODIMENT

Figure 1:
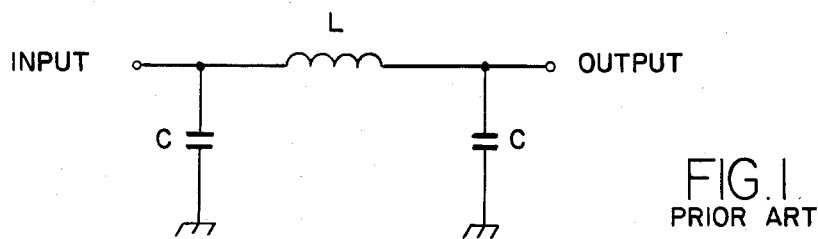
FIG. 1 is a schematic diagram of a prior art low pass L-C π section phase shift circuit.

Turning now to FIG. 1, there is shown a schematic diagram of a prior art low pass L-C π section phase shift circuit. The low pass L-C section phase shift circuit is a relatively simple circuit which comprises three circuit elements in the form of a π circuit utilizing an inductor L and two capacitors, C. As shown in FIG. 1, the low pass L-C π section phase shift circuit comprises an inductor, L which is serially connected between the input and the output of the phase shift circuit. A capacitor, C is connected from the input to ground and from the output to ground to form the low pass L-C π section configuration.

The low pass π section phase shift circuit which is shown in FIG. 1, will have its element values computed in such a way that, at a given center frequency $f_0$, desired phase shift $\phi_s$ is achieved with perfect transmission. In this case, the element values of the π section are given as follows:

$$\eta = \tan\left(\frac{\pi}{2} - \phi_s\right) \tag{1}$$

$$C = \frac{1}{\eta + \sqrt{\eta^2 + 1}} \tag{2}$$

$$L = \frac{2C}{1 + C^2} \tag{3}$$

where $\phi_s$ is the desired phase shift and the capacitors C and the inductance L are all normalized with respect to center frequency $f_0$ and the termination resistance $R_0$ which is not shown ($R_0$ possibly chosen at 50Ω). It should be observed from equation (1) that a phase shift between 0° and 180° is possible, that is, $$0 < \phi_s < 180° \quad (4)$$

Figure 2:
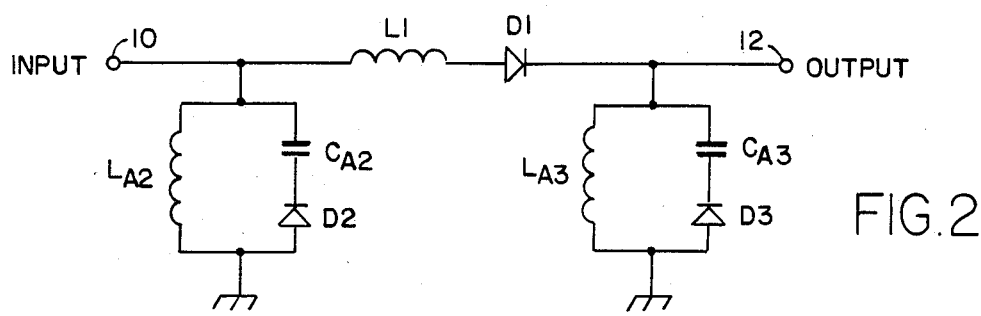
FIG. 2 is a schematic diagram of the low pass π section digital phase shifter apparatus according to the present invention.

Referring now to FIG. 2, there is shown a schematic diagram of the low pass $\pi$ section digital phase shifter apparatus according to a preferred embodiment of the present invention. The low pass $\pi$ section digital phase shifter apparatus comprises a series combination of an inductor L1 and a diode D1 which are connected between the input 10 and the output 12 of the digital phase shift circuit. A first parallel circuit which comprises an inductor $L_{A2}$ in parallel with the series combination of capacitor $C_{A2}$ and diode D2, is connected between the input 10 and ground. A second parallel circuit which is identical to the first parallel circuit in components and element values, is connected between the output 12 and ground. The second parallel circuit utilizes an inductor $L_{A3}$, capacitor $C_{A3}$ and diode D3 in the parallel/series configuration which is shown in FIG. 2. The operation of the low pass $\pi$ section digital phase shifter apparatus is basically the same as the phase shifting operation of the prior art low pass $\pi$ section which was described with respect to FIG. 1. For all practical considerations, all the diodes D1 through D3 of the digital phase shifter apparatus are assumed to be identical. This practical restriction can easily be removed considering the particular desired characteristics of the phase shifting operation.

Figure 3:
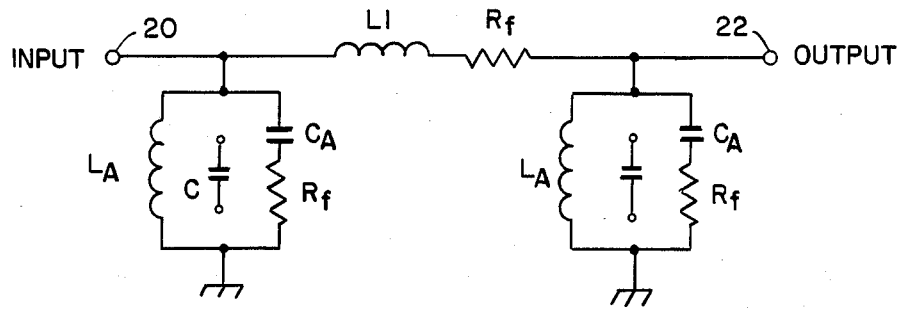
FIG. 3 is a schematic diagram of the low pass π section digital phase shifter apparatus in which the diodes are forward-biased.
Figure 4:
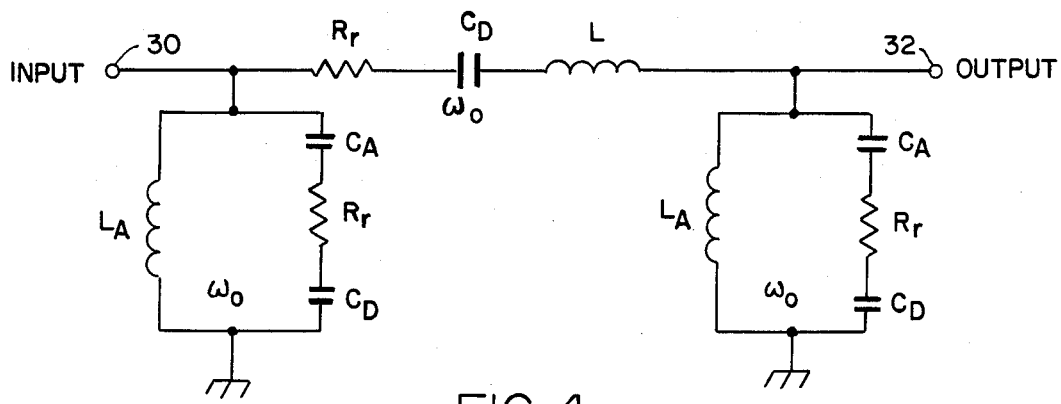
FIG. 4 is a schematic diagram of the low pass π section digital phase shifter apparatus in which the diodes are reversed-biased.

The operation of the low pass $\pi$ section digital phase shifter apparatus will be better understood when the following description is taken in conjunction with FIGS. 3 and 4. In FIG. 3 there is shown a schematic diagram of the low pass $\pi$ section digital phase shifter apparatus in which the diodes D1 through D3 of FIG. 2 are forward-biased (BIT-IN-State). When the diode D1 is forward-biased, the series circuit from the input 20 to the output 22 comprises the inductor L1 and the forward resistance, $R_f$ of the diode D1.

When the diodes D2 through D3 are forward biased (BIT-IN State) they act as closed short circuit switches. In this case, both shunt equation branches will see the effective capacitance which is fixed by equation (2) and the series arm will purely be the inductance L given by equation (3) except for the very small forward resistance $R_1$ of the forward biased diode D1. Both shunt circuits will be reduced to the parallel combination of inductor $L_A$ and the capacitor C which is the resultant equivalent of the forward-biased diode D2, D3 respectively. The forward-biased diodes D2, D3 both act as closed short circuit switches that is represented by the very small forward resistance $R_f$.

In FIG. 4, the diodes D1 through D3 are reversed-biased and the equivalent schematic diagram of the low pass $\pi$ section digital phase shifter apparatus is therein shown. When the diode D1 is reversed-biased (BIT-OUT-State), the series circuit from the input 30 to the output 32 comprises the inductor L1 in series with the reversed-biased equivalents of the diode D1 which is resistance $R_r$ and the capacitor $C_D$. In the reverse-biased mode, both shunt circuit brances reduce to the parallel combination of the inductor $L_A$ with the series elements of capacitor $C_A$, resistor $R_r$ and capacitor $C_D$. When diodes D2, D3 are reverse-biased, they respectively reduce to their equivalent circuit elements of a resistor $R_r$ in series with a capacitor $C_D$. For example, the original series circuit of FIG. 2 of capacitor $C_{A2}$ and diode D2, reduces to the series combination of the capacitor $C_A$, resistor $R_r$ and capacitor $LC_D$ when the diode D2 is reverse-biased.

When the diodes D1 through D3 in the low pass $\pi$ section digital phase shifter apparatus are reverse biased (BIT-OUT State), the inductance L which is in the series with the diode D1 capacitance $C_D$, resonate to provide a short circuit path to the input RF signal. Therefore, the value of the capacitance $C_D$ should be chosen such that:

$$C_D = \frac{1}{L} \quad (5)$$

In the shunt circuit branches, the inductance $L_A$ also resonates with capacitor $$C_T = \frac{C_A C_D}{\nu C_A + C_D}$$

providing an open path to the RF signal. Thus, in contrast to some conventional phase shifters, the low pass $\pi$ section digital phase shifter apparatus is perfectly matched at both switching states (i.e. insertion loss ideally be zero). In practice, however, ideal switch operation of the diodes will be perturbed by forward and reverse resistances $R_f$ and $R_r$ respectively.

Nevertheless, for a good switching diode, the forward and reverse resistances $R_f$ and $R_r$ should be equal to each other and should be small enough so as not to effect the phase shifting performance of the circuit.

In view of the above discussion, the capacitance $C_A$ and the inductance $L_A$ in the shunt circuit branches are defined as follows:

$$C_A = \frac{C + \sqrt{C^2 + 4CC_D}}{2} \quad (6)$$

$$L_A = \frac{1}{C_A - C} \quad (7)$$

Thus, the design equations of the present low loss $\pi$ section digital phase shifter are completely definitive for a practical application.

While the low pass $\pi$ digital phase shifter apparatus has been described with respect to discrete components, it should be noted that the circuit configuration of the present invention can be implemented either by discrete components or as a monolithic chip. If the monolithic approach is taken, any suitable type of readily available substrates, e.g., GaAs, GaInAs, Si, Inp, etc., can be used to realize the diodes and the remaining circuit elements may also be printed on the substrate as either lumped inductors and capacitors or they may be approximated by using transmission lines. In the case of the discrete implementation, any type of commericial available diodes may be used as long as they fulfill the above described electrical requirements. The capacitor elements may be lumped-chipped ceramic capacitors and the inductor elements may be realized as bond wires or ribbons below the Ku band, while the transmission lines may be used above the Ku band. It should be further noted that the D.C. biasing for the present apparatus is conventional, and that regular biasing inductive chokes may be used with low pass filters to biased the diodes. Alternatively, d.c. biasing lines may be printed on microstrip circuits if they are used, or on the substrate if monolithic approach is taken.

Although the invention has been described with reference to a particular embodiment, it will be understood to those skilled in the art that the invention is capable of a variety of alternative embodiments within the spirit and scope of the appended claims.

What is claimed is:

1. A low pass $\pi$ section digital phase shifter apparatus comprising in combination:
    a first inductor means having a first and second lead said first lead of said first inductor means forming an input terminal for an input signal,
    a first diode means having a first and second lead, said first lead of said first diode means connected to said second lead of said first inductor means, said first diode means having a first and second state, said second lead of said first diode means forming an output terminal,
    a first shunt circuit comprising a second inductor means in parallel with first capacitor means which is in series with a second diode means, one end of said second inductor means connected to one end of said first capacitor means to form a first junction, said first junction connected to said input terminal, the other end of said second inductor means connected to one end of said second diode means to form a second junction, said second junction connected to ground, said second diode means having a first and second state, and,
    a second shunt circuit comprising a third inductor means in parallel with second capacitor means which is in series with a third diode means, one end of said third inductor means connected to one end of said second capacitor means to form a third junction, said third junction connected to said output terminal, the other end of said third inductor means connected to one end of said third diode means to form a fourth junction, said fourth junction connected to ground, said third diode means having a first and second state.

2. A low pass $\pi$ section digital phase shifter apparatus as described in claim 1 wherein said first, second and third diodes means are identical.

3. A low pass $\pi$ section digital phase shifter apparatus as described in claim 2 wherein said first state of said first, second and third diode means is the forward-biased state and said second state of said first, second and third diode means is the reverse-biased state.

4. A low pass $\pi$ section digital phase shifter apparatus as described in claim 3 wherein the insertion loss of said digital phase shifter apparatus at both said first and second state of said first, second and third diode means is perfectly matched.

5. A low pass $\pi$ section digital phase shifter apparatus as described in claim 3 wherein said first, second and third diode means in said first state each respectively comprise a small forward resistance, $R_f$.

6. A low pass $\pi$ section digital phase shifter apparatus as described in claim 3 wherein said first, second and third diode means in said second state each respectively comprise a capacitance, $C_D$ and a reverse resistance, $R_r$.

7. A low pass $\pi$ section digital phase shifter apparatus as described in claim 6 wherein when said first, second and third diode means are in said second state said first inductor means resonates with said first diode means capacitance, $C_D$ to provide a short circuit path to an input RF signal, said first diode means capacitance, $C_D$ is defined according to the following equation:

$$C_D = \frac{1}{L};$$

where L is the inductance of said first inductor means.

8. A low pass $\pi$ section digital phase shifter apparatus as described in claim 7 wherein said first and second shunt circuits respectively resonate according to the equation:

$$C_T = \frac{C_A C_D}{C_A + C_D}$$

where $C_T$ is the total capacitance of the series capacitance path which is in parallel with the second and third inductor means respectively, and $C_A$ is the capacitance value respectively of said first and second capacitor means and $C_D$ is the value of the capacitance, $C_D$.

* * * * *

UNITED STATES PATENT AND TRADEMARK OFFICE
CERTIFICATE OF CORRECTION

PATENT NO. : 4,614,921

DATED : September 30, 1986

INVENTOR(S) : Binboga S. Yarman

It is certified that error appears in the above-identified patent and that said Letters Patent is hereby corrected as shown below:

Page 4, column 4, lines 20 through 23, equation which is $$"C_T = \frac{C_A C_D}{\nu C_A + C_D}"$$ should be $$-- C_T = \frac{C_A C_D}{C_A + C_D} --$$

Signed and Sealed this

Seventeenth Day of February, 1987

Attest:

DONALD J. QUIGG

Attesting Officer      Commissioner of Patents and Trademarks